United States Patent [19]

Bonn

[11] Patent Number: 4,626,317
[45] Date of Patent: Dec. 2, 1986

[54] METHOD FOR PLANARIZING AN ISOLATION SLOT IN AN INTEGRATED CIRCUIT STRUCTURE

[75] Inventor: Matthew A. Bonn, Saratoga, Calif.

[73] Assignee: Advanced Micro Devices, Inc., Sunnyvale, Calif.

[21] Appl. No.: 719,185

[22] Filed: Apr. 3, 1985

[51] Int. Cl.⁴ ............... H01L 21/306; B44C 1/22; C03C 15/00; C03C 25/06
[52] U.S. Cl. .................. 156/643; 29/576 W; 29/580; 156/646; 156/648; 156/650; 156/653; 156/657; 156/662; 357/49; 357/59; 427/93
[58] Field of Search ........... 29/576 W, 580; 156/643, 156/646, 648, 650, 653, 657, 659.1, 661.1, 662; 427/93; 357/49, 59

[56] References Cited

U.S. PATENT DOCUMENTS

| | | | |
|---|---|---|---|
| 4,493,740 | 1/1985 | Komeda | 29/576 W |
| 4,528,047 | 7/1985 | Beyer et al. | 156/648 X |
| 4,546,538 | 10/1985 | Suzu | 156/657 X |

FOREIGN PATENT DOCUMENTS 0157044 12/1981 Japan .................. 29/576 W

*Primary Examiner*—William A. Powell
*Attorney, Agent, or Firm*—Patrick T. King; J. Vincent Tortolano; John P. Taylor

[57] ABSTRACT

An improved method for planarizing an isolation slot, having its walls previously oxidized, is disclosed which comprises depositing a first layer of a material; etching the first layer back to a predetermined depth below a reference point; depositing a second layer of an oxidizable material on the surface of the first layer; etching the second layer; and then oxidizing the second layer of oxidizable material. Formulas are disclosed for calculating the minimum and maximum depths of the etch back of the second layer and the minimum depth of the etch back of the first layer given the width of the slot and the thickness of the oxide layer to be grown in the surface of the second layer to thereby insure that any voids, microcracks, or discontinuities formed in the second layer are removed by the etch and that the oxide subsequently grown in the surface of the second layer does not penetrate down to the surface of the first layer and any voids, microcracks, or discontinuities therein.

11 Claims, 5 Drawing Figures

METHOD FOR PLANARIZING AN ISOLATION SLOT IN AN INTEGRATED CIRCUIT STRUCTURE

BACKGROUND OF THE INVENTION

1. Technical Field of the Invention

This invention relates to the construction of an isolation trench or slot in an integrated circuit structure. More particularly, this invention relates to an improved method for planarizing an isolation slot to eliminate the deleterious effects of microcracks, discontinuities, or voids occurring in the material used to fill the isolation slot for planarization.

2. Description of the Prior Art

Isolation slots or trenches are utilized in integrated circuit structures to provide a barrier in the silicon substrate between adjacent active devices. Such an isolation technique is described in Bondur et al U.S. Pat. No. 4,104,086. After initial formation of the slot, the walls are oxidized to form a silicon dioxide dielectric which provides the desired electrical isolation between adjacent active devices in the silicon substrate.

To prevent or inhibit formation of a step in overlying layers, it is desirable to completely fill the slot. This could be done by growing sufficient oxide within the slot. However, since silicon oxide occupies a larger volume than the silicon from which it is grown, attempts to completely fill the slot with oxide can result in the formation of stresses which may ultimately damage the structure. Alternatively, growing sufficient oxide to fill the slot can result in the creation of voids due to the tendency of the oxide to neck in at the top of the slot depending upon the slot dimensions. Subsequent etch back of the oxide then can result in opening of the void which can have undesirable consequences. Therefore, the remainder of the slot is preferably filled with polysilicon to permit subsequent planarization.

However, even the use of polysilicon is not without difficulties. The polysilicon deposited in the slot over the isolation oxide may also tend to neck in at the top of the slot thereby creating an unfilled volume or void below. Even when a void is not created, a microcrack, or discontinuity may be created where the deposited polysilicon on the sidewalls of the slot finally touch when the width of the slot is less than one-half of the depth. Since it is usually desirable to provide a slot having a minimum width from a space standpoint, this condition frequently occurs. Subsequent oxidation of the structure for planarization or isolation purposes, e.g., in multilayer structures, can result in stress formation if the oxidizing conditions penetrate the void, discontinuity, or crack in the polysilicon.

The use of multistep techniques to alleviate the effects of voids in materials used for planarization is known. Thomas et al U.S. Pat. No. 4,481,070, assigned to the assignee of this invention, describes and claims such a technique for mitigating the effects of such voids formed in silicon dioxide between closely spaced together metal lines when growing silicon dioxide to planarize an integrated circuit structure.

However, when an oxidizable material is used for planarization purposes, the amount removed by etching during planarization must be further interrelated to the penetration of subsequently grown oxide therein. This is because the growth of an oxide on or in the surface of an oxidizable material consumes a portion of the oxidizable material and thus effectively penetrates below the former surface of the oxidizable material. For example, the oxidation of polysilicon results in the growth of polysilicon dioxide having a thickness which extends about 55% above the preexisting surface of the polysilicon and about 45% below the surface. Any attempts to provide multistep polysilicon deposition for planarization must take this oxide penetration into account to be effective.

SUMMARY OF THE INVENTION

It is therefore an object of this invention to provide an improved method for planarizing an isolation slot in an integrated circuit structure using a multistep deposition technique for filling and planarizing the isolation slot.

It is another object of this invention to provide an improved method for planarizing an isolation slot in an integrated circuit structure using a multistep deposition technique for filling and planarizing the isolation slot comprising depositing a first layer of an oxidizable material and then etching away a sufficient amount of the first deposit to permit further deposition of a second layer of oxidizable material over the first layer.

It is yet another object of this invention to provide an improved method for planarizing an isolation slot in an integrated circuit structure using a multistep deposition technique for filling and planarizing the isolation slot comprising depositing a first layer of an oxidizable material, etching away a sufficient amount of the first deposit to permit further deposition of a second layer over the first layer, and then etching back the second layer to a point below any voids, discontinuities, or microcracks in the second layer but above the surface of the first layer.

It is a further object of this invention to provide an improved method for planarizing an isolation slot in an integrated circuit structure using a multistep deposition technique for filling and planarizing the isolation slot comprising depositing a first layer of an oxidizable material, etching away a sufficient amount of the first deposit to permit further deposition of a second layer over the first layer, etching back the second layer to a point below any voids, discontinuities, or microcracks in the second layer but above the surface of the first layer by an amount sufficient to prevent penetration to any microcracks, voids, or discontinuities in the first layer of an oxide subsequently grown in the surface of the second layer.

It is yet a further object of this invention to provide an improved method for planarizing an isolation slot in an integrated circuit structure using a multistep deposition technique for filling and planarizing the isolation slot comprising depositing a first layer of an oxidizable material, etching away a sufficient amount of the first deposit to permit further deposition of a second layer over the first layer, etching back the second layer to a point below any voids, microcracks, or discontinuities in the second layer but above the surface of the first layer by an amount greater than, 0.45 of the thickness of an oxide subsequently grown in the surface of the second layer to thereby prevent penetration to any microcracks, or voids in the first layer of such an oxide as it is subsequently grown in the surface of the second layer.

In accordance with the invention, an isolation slot, having its walls previously oxidized, is planarized by depositing a first layer of an oxidizable material such as polysilicon, etching the first layer back to a predetermined depth, depositing a second layer of polysilicon, and etching the second layer back to a depth below any void, microcrack, or discontinuity in the second layer but above the etch depth of the first layer by an amount greater than 45% of the thickness of an oxide layer subsequently grown on the etched surface of the second polysilicon deposition layer. This oxide layer will not, therefore, enter any voids, microcracks, or discontinuities in the second layer (because these have been etched away) nor penetrate deep enough into the second layer to reach any voids, microcracks, or discontinuities in the first polysilicon layer thereunder.

DESCRIPTION OF THE PREFERRED EMBODIMENT

Figure 1:
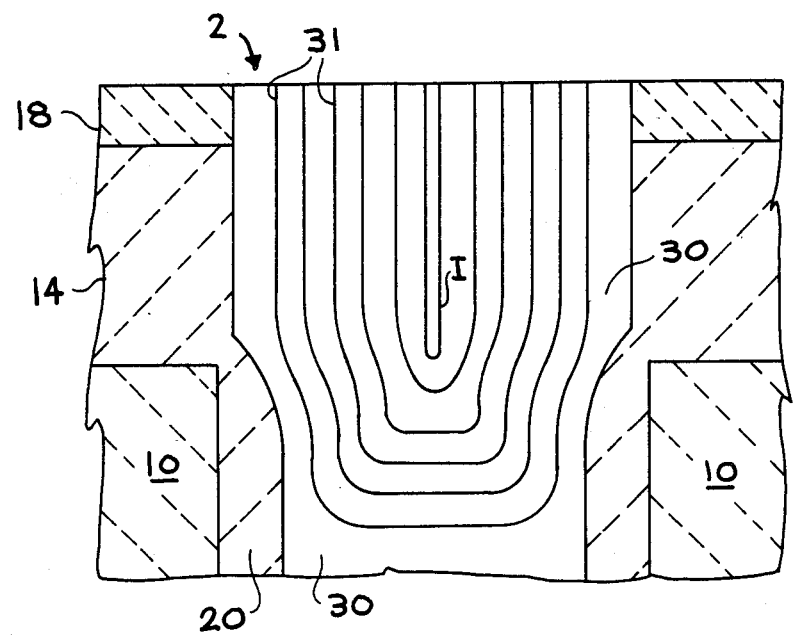
FIG. 1 is a fragmentary vertical cross-section view of a prior art isolation slot filled with polysilicon.

Referring now to FIG. 1, an isolation slot is generally shown at 2 which has been planarized in accordance with the prior art. Slot 2, previously formed in a silicon substrate 10, through a mask comprising an oxide layer 14 and a nitride layer 18, has been partially oxidized at 20 on the silicon sidewalls of the slot to provide the desired isolation. Polysilicon 30 has then been deposited and planarized prior to removal of the nitride layer 18 and oxidation of polysilicon 30. The lines 31 in FIG. 1 are intended to depict the deposition of the polysilicon (by showing layering for illustrative purposes only) to show how the polysilicon, deposited on the opposing sidewalls of slot 2, eventually touches to form a possible void, microcrack, or discontinuity at I while the bottom of slot 2 is still being filled. As can be seen at I, due to the depth of slot 2 relative to its width and the uniform deposition of polysilicon 30, the polysilicon deposited on the opposite side walls has begun to touch, thus forming a void, microcrack, or discontinuity. Subsequent oxidation of polysilicon 30 can result in oxide forming in the void, microcrack, or discontinuity resulting in stress formation and possible damage to the integrated circuit structure.

The method of the invention eliminates this possibility of stress formation by oxide in any void, microcrack, or discontinuity formed in the polysilicon by a two step process in which sufficient polysilicon, deposited in the first step, is removed to permit a second deposition which will cover up or bury any remaining voids, microcracks, or discontinuities in the first polysilicon layer. A sufficient amount of the second layer is then removed to eliminate any voids, discontinuities, or microcracks formed in the second layer. As will be discussed in more detail below, it is, however, important that the amount of polysilicon removed from the second layer be insufficient to result in penetration of the first layer by oxide subsequently formed in the surface of the second polysilicon layer.

Figure 2:
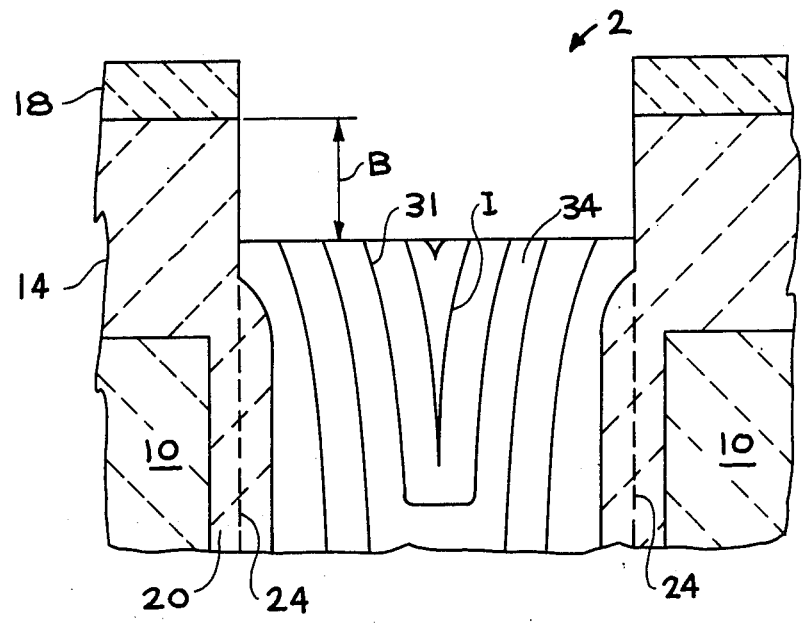
FIG. 2 is a fragmentary vertical cross-section view of a first step of the method of the invention.

In FIG. 2, the first step of the invention is illustrated. A silicon substrate 10, is masked as previously described with an oxide mask 14 and a nitride mask 18 to form slot 2 partially shown at dotted lines 24. The walls of the slot are then oxidized to form oxide 20 which functions as the isolation oxide. A layer of polysilicon 30 is then deposited in the slot and etched down to line 34 representing a distance B from the top of oxide layer 14.

Figure 3:
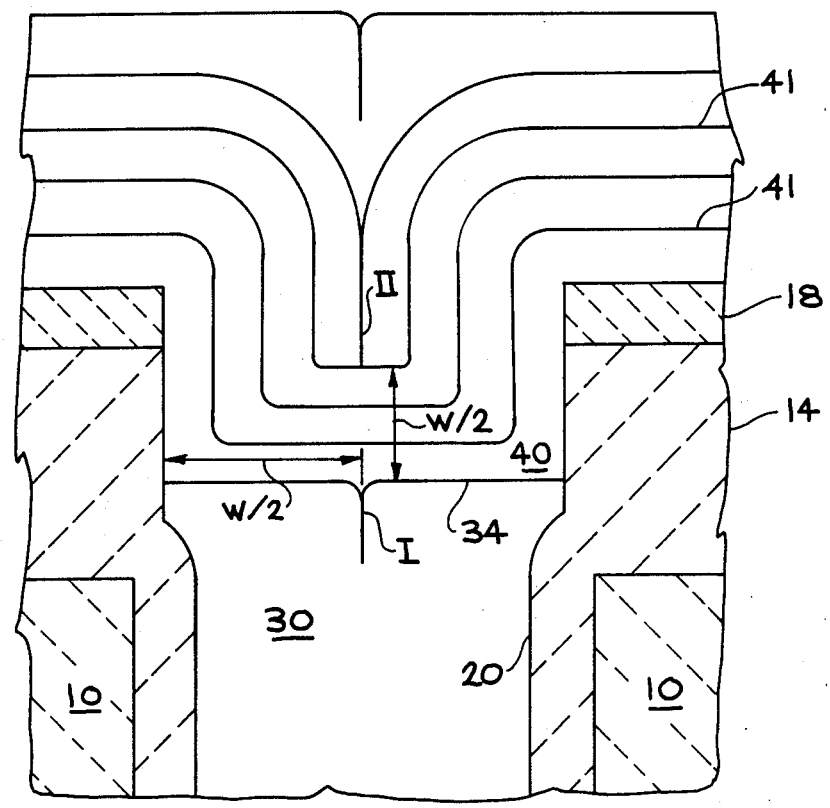
FIG. 3 is a fragmentary vertical cross-section view of a second step of the method of the invention.

Lines 31 have been used again for illustrative purposes to show how the polysilicon deposits and thus forms the void or microcrack at I. However, unlike the prior art practice of filling the slot with polysilicon followed by oxidation of the polysilicon, polysilicon layer 30 has been etched back to line 34 in accordance with the invention in preparation for a second deposition of polysilicon as shown in FIG. 3.

The etching of polysilicon layer 30 back to line 34 is preferably performed as an anisotropic etch such as a plasma etch using chlorine materials which removes polysilicon from the entire width of the slot down to line 34. In this way, effectively twice as much polysilicon is removed from the walls of the slot as from the bottom thus permitting deposition of a further amount of polysilicon in a second layer 40 without immediately forming a further discontinuity or microcrack region. As shown in FIG. 3, the eventual formation of a new microcrack or discontinuity region II in polysilicon layer 40 is well above microcrack or discontinuity region I in polysilicon layer 30.

Figure 4:
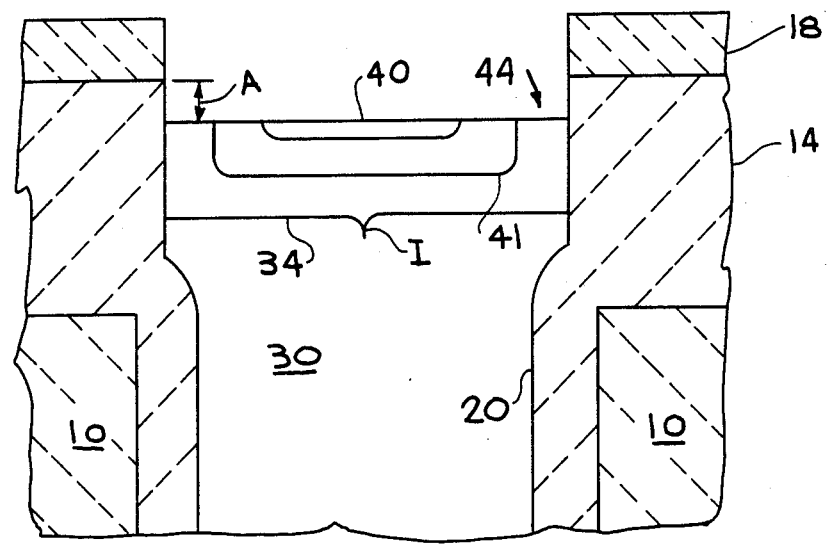
FIG. 4 is a fragmentary vertical cross-section view of a third step of the method of the invention.

Following the second deposition of polysilicon to form layer 40, a second etch is performed to etch layer 40 back to line 44, a distance A from the top of oxide layer 14 as shown in FIG. 4. This second etch may comprise either an isotropic etch or an anisotropic etch since the etch will be performed to remove sufficient polysilicon in layer 40 to eliminate discontinuity or microcrack portion II as shown in FIG. 4. With the elimination of discontinuity or microcrack portion II from layer 40 by this etch back, subsequent oxidation in and on the surface of polysilicon layer 40 will be uniform.

Figure 5:
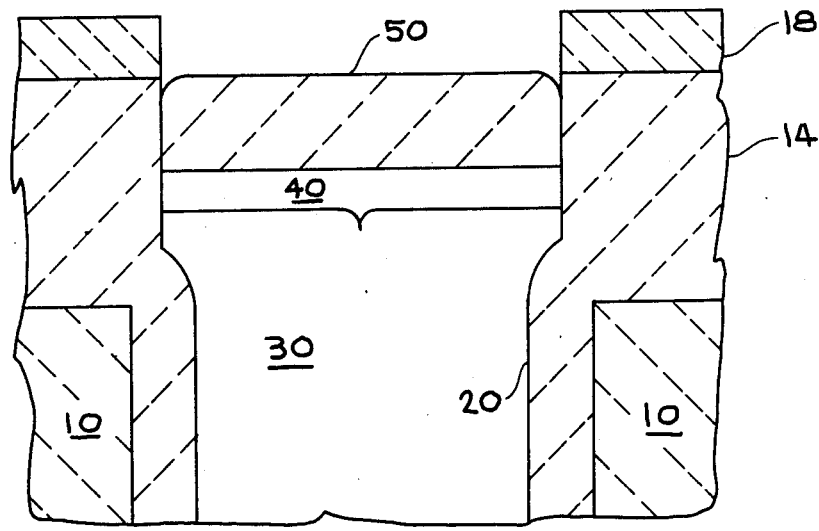
FIG. 5 is a fragmentary vertical cross-section view of the final step of the method of the invention.

However, oxidation of polysilicon layer 40 will extend into the layer as a portion of the polysilicon in layer 40 is oxidized. This extension into the polysilicon from the original surface has been found to be about 45% of the thickness of the polysilicon oxide formed. Thus as the thickness of the polysilicon oxide increases, the distance which the oxide extends into the layer from the original surface of the polysilicon increases. Since the object of the invention is to eliminate the formation of oxide in a microcrack region, it is very important that the oxide layer 50, formed in the surface of polysilicon layer 40 as shown in FIG. 5, does not reach the buried microcrack region I in first polysilicon layer 30. In order to insure that this does not happen the depth of the etch of first polysilicon layer 30, i.e., depth B, and the depth of the etch of layer 40, i.e., depth A, and the amount of oxidation of layer 40, must be carefully controlled.

Depth A and depth B are also related to the width W of the slot as well as the thickness T of the oxide to be grown in the surface of polysilicon layer 40. Since the polysilicon deposits equally on the bottom and sidewalls of the slot, a microcrack or void can start when the thickness of the polysilicon, i.e., the depth of the deposit, exceeds $W/2$. Thus the minimum depth A of the etch back of layer 40 should exceed $B-W/2$ to insure that any microcrack in layer 40 has been etched away. However, depth A should not be so deep, with respect to depth B that subsequent oxidation of the surface of layer 40 will penetrate sufficiently into layer 40 to reach depth B, i.e., the surface of layer 30 and any remaining portions of microcrack I which were buried by layer 40. Since polysilicon oxide grown in the surface of layer 40 will extend below the surface about 45% of the total thickness of the oxide, the maximum etch depth A should be less than depth B−45% of T where T is the thickness of the oxide grown in the surface of layer 40.

Furthermore, to provide a range of safety, the minimum difference D between the minimum depth A and the maximum depth A should be at least 0.3 microns.

The minimum depth B could then be selected to be 0.45T when A=0.

It should also be noted that the thickness of oxide layer 50, grown in the surface of polysilicon layer 40, should advantageously be sufficient to at least extend to the top of oxide layer 14 within ±0.2 microns to thereby provide the desired planarized profile across the slot.

Thus, given the width W of the slot, the desired range between the minimum and the maximum depths of the etch back depth A of layer 40, and the thickness T of the oxide layer to be grown in the surface of layer 40, the depth B of the etch in first layer 30 and the minimum and maximum depths A of the etch in second layer 40 may be empirically determined using the following formulas:

Minimum depth A is greater than B−W/2 or 0 if B−W/2 is less than 0 (where W=width of slot)

Maximum depth A less than B−0.45T (where B=depth of etch in first layer and T=thickness of oxide to be grown in surface of second layer)

D=Maximum depth A−Minimum depth A

Minimum D=at least 0.3 microns

Minimum depth B greater than 0.45T (where T=thickness of oxide to be grown in surface of second layer)

For example, using polysilicon to fill a 2 micron width slot (W=2); where the distance between minimum depth A and maximum depth A=0.3 micron (D=0.3); and the oxide to be grown is at least 0.3 micron thick (T=0.3); the minimum depth B and the minimum and maximum values of depth A can be calculated as follows:

$B_{min} = 0.45T$ (where A=0)
$A_{min} = B - W/2$ (If B−W/2 greater than 0)
$A_{max} = B - 45\% \, T$ Thus, if the first polysilicon layer 30 was etched to a depth of 1.0 microns below the top of oxide layer 14, and a second layer 40 of polysilicon was then deposited over the remainder of layer 30 and etched back 0.3 microns, 0.9 microns of oxide grown on the surface of the remaining portion of layer 40 would extend down 0.45×0.9=0.4 microns below the former surface (after etching). The oxide would thus extend 0.3+0.4=0.7 microns below the surface of oxide layer 14. This would put the oxide 0.3 microns above the top of lower polysilicon layer 30 and any voids or microcracks therein.

Furthermore, the amount of polysilicon etched away from the surface of polysilicon layer 40, i.e., 0.3 microns which is greater than B−W/2 by 0.3 microns, would insure that any microcracks or voids in the surface of second layer 40 would be etched away prior to the oxidation of the surface of the remaining portion of layer 40.

At the same time, the oxide in the slot would extend 0.55×0.9=0.5 microns above the former surface of upper layer 40 after it was etched down to 0.3 microns below the surface of oxide layer 14, i.e., the oxide formed in the slot over layer 40 would be almost flush (within 0.2 microns) with oxide layer 14 which is desirable for planarization.

If A was chosen to be 0.5 microns instead of 0.3, an even higher degree of planarization could be achieved. A 0.9 micron oxide layer would then extend 0.4 microns below the 0.5 micron level to 0.9 microns or 0.1 microns above the surface of first layer 30. Furthermore, the oxide extending above the surface of layer 40 would be 0.55×0.9=0.5 microns or just exactly even with the surface of the adjoining oxide layer 14.

Thus, the invention provides an improved method for making an isolation slot, and more particularly for planarizing an isolation slot without incurring stresses set up by oxidation of microcracks in the oxidizable material used to fill the slot for planarization purposes. By using the particular multistep process of the invention as described, microcracks or voids occurring in the first layer may be buried by a second layer and microcracks or voids occurring in the second layer may be removed prior to oxidation of the second layer.

Furthermore, by careful control of the depths of the etch back of each layer, as well as control of the amount of oxidation, one can insure that the oxidation of the second layer will not penetrate to the buried voids or microcracks in the first layer and also provide a final level in the slot area approximating that of the adjacent oxide to provide a high degree of planarization.

Having thus described the invention, what is claimed is:

1. An improved method for forming an isolation slot wherein the penetration of subsequently formed oxide into microcracks or voids formed in the filler material is inhibited which comprises:
   (a) forming an isolation slot in an oxidizable substrate;
   (b) oxidizing the walls of the slot to form an oxide layer capable of functioning as an isolation oxide;
   (c) filling the slot by depositing polysilicon therein;
   (d) etching the polysilicon in the slot to remove a predetermined amount of polysilicon from both the bottom and the sides of said slot to leave a first layer of polysilicon in said slot;
   (e) depositing a second layer of polysilicon in said slot over said etched first layer of polysilicon;
   (f) etching said second layer of polysilicon; and
   (g) oxidizing the surface of said second layer of polysilicon.

2. The method of claim 1 wherein said step of etching said polysilicon initially deposited in said slot comprises anisotropically etching said polysilicon.

3. The method of claim 1 including the further step of etching back the second layer to a point below any voids, microcracks, or discontinuities in the second layer but above the surface of the first layer.

4. The method of claim 3 wherein the step of etching back the second layer comprises etching the second layer to a point below any voids, microcracks, or discontinuities in the second layer but above the surface of the first layer by an amount sufficient to prevent penetration to the first layer of an oxide subsequently grown in the surface of the second layer.

5. The method of claim 4 wherein said step of etching back the second layer to a point below any voids, microcracks, or discontinuities in the second layer comprises etching the second layer to a point above the surface of the first layer by an amount greater than 0.45 of the thickness of an oxide subsequently grown in the surface of the second layer to thereby prevent penetration to the first layer of such an oxide as it is subsequently grown in the surface of the second layer.

6. An improved method for planarizing an isolation slot, having its walls previously oxidized, comprises:
   (a) depositing a first layer of a material;
   (b) etching said first layer back to a predetermined depth below a reference point;
   (c) depositing a second layer of an oxidizable material on the surface of said first layer;
   (d) etching said second layer; and
   (e) oxidizing said second layer of oxidizable material.

7. The method of claim 6 wherein the step of etching said second layer comprises etching said second layer to a minimum depth below said reference point of at least greater than the depth of the etch of the first layer less ½ the width of said isolation slot to thereby etch said second layer back to a depth below any voids, microcracks, or discontinuities in said second layer.

8. The method of claim 7 wherein said step of etching back said second layer comprises etching said second layer to a maximum depth less than the depth of the surface of said first layer from said reference point minus 0.45 times the thickness of said oxide formed in the surface of said second layer whereby said oxide formed in the surface of said second layer will not penetrate to the surface of said first layer to thereby prevent inadvertent oxidation of any voids, microcracks, or discontinuities in said first layer buried by said second layer.

9. The method of claim 8 wherein said reference point is the top surface of the material adjoining said slot whereby said depositions and oxidation will fill said slot to a level approximating that of said adjoining material to achieve said desired planarization.

10. The method of claim 9 wherein said step of etching said first layer back to a predetermined point comprises etching said first layer a distance below said reference point greater than the sum of $A_{max}+0.45$ times the thickness of the oxide to be grown in the surface of said second layer; whereby said first layer will not be penetrated by said oxide grown in the surface of said second layer and any voids or microcracks in said first layer will therefore not be oxidized by said oxidation step.

11. An improved method for planarizing an isolation slot, having its walls previously oxidized, comprises:
   (a) depositing a first layer of a material;
   (b) etching said first layer back to a predetermined depth below a reference point;
   (c) depositing a second layer of an oxidizable material on the surface of said first layer;
   (d) etching said second layer back to a depth below any void or microcrack in the said second layer but above the etch depth of said first layer by an amount greater than 45% of the thickness of an oxide layer subsequently grown on the etched surface of said second layer; and
   (e) oxidizing said second layer of oxidizable material. whereby said oxide will not enter any voids or microcracks in said second layer nor penetrate deep enough into said second layer to reach any voids or microcracks in said first layer thereunder.

* * * * *